United States Patent
Higo et al.

(10) Patent No.: US 8,625,342 B2
(45) Date of Patent: Jan. 7, 2014

(54) STORAGE ELEMENT AND STORAGE DEVICE

(75) Inventors: Yutaka Higo, Kanagawa (JP); Masanori Hosomi, Tokyo (JP); Hiroyuki Ohmori, Kanagawa (JP); Kazuhiro Bessho, Kanagawa (JP); Tetsuya Asayama, Tokyo (JP); Kazutaka Yamane, Kanagawa (JP); Hiroyuki Uchida, Kanagawa (JP)

(73) Assignee: Sony Corporation, Tokyo (JP)

( * ) Notice: Subject to any disclaimer, the term of this patent is extended or adjusted under 35 U.S.C. 154(b) by 20 days.

(21) Appl. No.: 13/461,437

(22) Filed: May 1, 2012

(65) Prior Publication Data

US 2012/0300541 A1  Nov. 29, 2012

(30) Foreign Application Priority Data

May 23, 2011 (JP) ................................. 2011-114439

(51) Int. Cl.
*G11C 11/14* (2006.01)

(52) U.S. Cl.
USPC ........... 365/171; 365/148; 365/158; 977/933; 977/935

(58) Field of Classification Search
USPC ......... 365/48, 55, 62, 66, 74, 78, 80–93, 100, 365/130, 131, 148, 158, 171–173, 209, 213, 365/225.5, 230.07, 232, 243.5; 216/22; 257/421, E21.665; 438/3; 428/810–816, 817–825.1, 826; 977/933–935
See application file for complete search history.

(56) References Cited

U.S. PATENT DOCUMENTS

| | | | |
|---|---|---|---|
| 6,256,223 B1 | 7/2001 | Sun | |
| 7,193,890 B2 * | 3/2007 | Nagase et al. | 365/158 |
| 7,224,601 B2 * | 5/2007 | Panchula | 365/158 |
| 7,382,643 B2 * | 6/2008 | Ashida et al. | 365/158 |
| 7,596,015 B2 * | 9/2009 | Kitagawa et al. | 365/158 |
| 2006/0262594 A1 * | 11/2006 | Fukumoto | 365/158 |
| 2007/0030724 A1 * | 2/2007 | Hosomi et al. | 365/158 |

(Continued)

FOREIGN PATENT DOCUMENTS

| | | |
|---|---|---|
| JP | 2003-017782 | 1/2003 |
| JP | 2008-227388 | 9/2008 |

OTHER PUBLICATIONS

L. Berger, "Emission of spin waves by a magnetic multilayer traversed by a current," The American Physical Society, Physical Review B, vol. 54, No. 13, Oct. 1, 1996, pp. 9353-9358. (6 pages).

(Continued)

*Primary Examiner* — Harry W Byrne
(74) *Attorney, Agent, or Firm* — K&L Gates LLP

(57) ABSTRACT

A storage element includes: a storage layer which retains information by a magnetization state of a magnetic substance; a magnetization pinned layer having magnetization which is used as the basis of the information stored in the storage layer; and an interlayer of a non-magnetic substance provided between the storage layer and the magnetization pinned layer. The storage element is configured to store information by reversing magnetization of the storage layer using spin torque magnetization reversal generated by a current passing in a laminate direction of a layer structure including the storage layer, the interlayer, and the magnetization pinned layer, and when the saturation magnetization of the storage layer and the thickness thereof are represented by Ms (emu/cc) and t (nm), respectively, $(1489/Ms)-0.593 < t < (6820/Ms)-1.55$ holds.

6 Claims, 7 Drawing Sheets

(56) References Cited

U.S. PATENT DOCUMENTS

2007/0076469 A1* 4/2007 Ashida et al. ............... 365/158
2007/0263429 A1* 11/2007 Yamamoto et al. ........... 365/158
2009/0219754 A1* 9/2009 Fukumoto .................... 365/158

OTHER PUBLICATIONS

J.C. Slonczewski, "Current-driven excitation of magnetic multilayers," Journal of Magnetism and Magnetic Materials, vol. 159, 1996, pp. L1-L7. (7 pages).

* cited by examiner

STORAGE ELEMENT AND STORAGE DEVICE

CROSS REFERENCES TO RELATED APPLICATIONS

The present application claims priority to Japanese Priority Patent Application JP 2011-114439 filed in the Japan Patent Office on May 23, 2011, the entire content of which is hereby incorporated by reference.

BACKGROUND

The present disclosure relates to a storage element having a plurality of magnetic layers and performing recording using spin torque magnetization reversal and to a storage device using the storage element.

Concomitant with significant developments of various information apparatuses including mobile terminals, large capacity servers, and the like, elements, such as memories and logics, forming those apparatuses are also requested to improve performance, such as increase in integration degree, increase in operation speed, and reduction in power consumption. In particular, advancement in non-volatile semiconductor memories has been remarkable, and flash memories each functioning as a large capacity file memory have been increasingly in demand so as to replace hard disk drives.

In addition, in consideration of expansion into code storages and working memories, development of ferroelectric random access memories (FeRAMs), magnetic random access memories (MRAMs), phase-change random access memories (PCRAMs), and the like has been pursued in order to replace NOR flash memories, DRAMs, and the like, which are now commonly used. Some of those memories mentioned above have been already put into practical use.

In particular, since data is stored using the magnetization direction of a magnetic material, the MRAM is capable of performing high-speed and almost-infinite ($10^{15}$ times or more) rewriting operations and has already been used in the fields of industrial automation, airplane, and the like. Because of its high-speed operation and high reliability, the MRAM is expected to be expanded into the code storage and the working memory in the future; however, in practice, there are problems to be overcome, such as reduction in power consumption and increase in capacity. These mentioned above are intrinsic problems resulting from the recording principle of the MRAM, that is, resulting from the method in which magnetization reversal is performed by a current magnetic field generated from a wire.

As one method to solve these problems, a recording method using no current magnetic field, that is, a magnetization reversal method, has been studied. In particular, researches on spin torque magnetization reversal have been actively performed (for example, see Japanese Unexamined Patent Application Publication Nos. 2003-17782 and 2008-227388, U.S. Pat. No. 6,256,223, Phys. Rev. B, 54, 9353 (1996), and J. Magn. Mat., 159, L1 (1996)).

A storage element of the spin torque magnetization reversal is frequently formed using a magnetic tunnel junction (MTJ) as in the case of the MRAM.

This structure uses a phenomenon in which spin-polarized electrons passing through a magnetic layer pinned in a certain direction impart torque (also called spin transfer torque in some cases) to another free magnetic layer (the direction of which is not pinned) when entering this free magnetic layer, and the magnetization of the free magnetic layer is reversed by passing a current equivalent to or more than a certain threefold value. Rewriting of 0/1 is performed by changing the polarity of the current.

The absolute value of the current for this reversal is 1 mA or less in an element having a scale of approximately 0.1 µm. In addition, scaling can be performed because this current value decreases in proportion to the element volume. Furthermore, since a word line for generating a current magnetic field for recording, which is necessary for the MRAM, is not necessary in this case, the cell structure can be advantageously simplified.

Hereinafter, the MRAM using the spin torque magnetization reversal will be referred to as the "spin torque-magnetic random access memory (ST-MRAM)". The spin torque magnetization reversal may also be referred to as the spin injection magnetic reversal in some cases.

SUMMARY

Incidentally, in the case of the MRAM, writing wires (a word line and a bit line) are provided besides the storage element, and information is written (recorded) by a current magnetic field generated by passing a current through the writing wires. Therefore, a sufficient current necessary for writing can be passed through the writing wires.

On the other hand, in the ST-MRAM, the spin torque magnetization reversal is performed by a current to be passed in the storage element, and the direction of magnetization of a storage layer is reversed. In addition, since the current is directly passed in the storage element for writing (recording) of information as described above, in order to select a memory cell which performs writing, the storage element is connected to a selection transistor to form a memory cell.

In this case, a current to be passed in the storage element is restricted to a current (saturation current of the selection transistor) which can be passed in the selection transistor.

For this reason, since it has been understood that writing has to be carried out by a current equivalent to or less than the saturation current of the selection transistor, and that the saturation current of the transistor decreases as miniaturization is advanced, in order to perform miniaturization of the ST-MRAM, it is necessary to improve the efficiency of spin transfer and to decrease a current to be passed in the storage element. The current necessary for the spin torque magnetization reversal is called, for example, a reverse current or a record current.

When variation in reverse current between storage elements is taken into consideration, a large selection transistor has to be designed, and as a result, a decrease in capacity and an increase of power consumption may occur.

In addition, since the ST-MRAM is a non-volatile memory, information written by a current has to be stably stored. That is, the stability (thermal stability) against heat fluctuation of magnetization of the storage layer has to be ensured.

Accordingly, it is preferable to provide a storage element as the ST-MRAM which suppresses the variation in reverse current and thermal stability.

A storage element according to an embodiment of the present disclosure includes: a storage layer which retains information by a magnetization state of a magnetic substance; a magnetization pinned layer having magnetization which is used as the basis of the information stored in the storage layer; and an interlayer of a non-magnetic substance provided between the storage layer and the magnetization pinned layer. In addition, the storage element is configured to store information by reversing magnetization of the storage layer using spin torque magnetization reversal generated by a current passing in a laminate direction of a layer structure including the storage layer, the interlayer, and the magnetization pinned layer, and when the saturation magnetization of the storage layer and the thickness thereof are represented by Ms (emu/cc) and t (nm), respectively, (1489/*Ms*)−0.593<*t*<(6820/*Ms*)−1.55 holds.

A storage device according to an embodiment of the present disclosure includes: a storage element which retains information by a magnetization state of a magnetic substance; and two types of wires intersecting each other. In addition, the storage element includes a storage layer which retains information by a magnetization state of a magnetic substance, a magnetization pinned layer having magnetization which is used as the basis of the information stored in the storage layer, and an interlayer of a non-magnetic substance provided between the storage layer and the magnetization pinned layer and is configured to store information by reversing magnetization of the storage layer using spin torque magnetization reversal generated by a current passing in a laminate direction of a layer structure including the storage layer, the interlayer, and the magnetization pinned layer, and when the saturation magnetization of the storage layer and the thickness thereof are represented by Ms (emu/cc) and t (nm), respectively, 1489/Ms)−0.593<t<(6820/Ms)−1.55 holds. In addition, the storage element is arranged between the two types of wires, and the current in a laminate direction passes in the storage element through the two types of wires, so that the spin torque magnetization reversal occurs.

In the above technique of the present disclosure, when the saturation magnetization Ms of the storage layer and the thickness t thereof are appropriately set in combination, even if the shape of the storage layer varies, the variation in thermal stability and reverse current can be suppressed.

The variation in reverse current and thermal stability is generated by the variation in shape of the storage element. The variation in shape of the storage element is generated to some extent due to manufacturing errors thereof.

Hence, when the thickness t of the storage layer is set so as to satisfy the above condition, the variation in reverse current and thermal stability can be suppressed.

According to the present disclosure, in the storage element as the ST-MRAM, the variation in thermal stability and reverse current can be suppressed.

Hence, a highly reliable memory which operates stably can be realized.

In addition, the reverse current can be decreased, and hence power consumption used when writing is performed in the storage element can be reduced.

Additional features and advantages are described herein, and will be apparent from the following Detailed Description and the figures.

DETAILED DESCRIPTION

Hereinafter, embodiments of the present disclosure will be described in the following order.

<1. Structure of storage device according to embodiment>
<2. Outline of storage element according to embodiment>
<3. Description of variation in thermal stability and reverse current>
<4. Structure according to embodiment>
<5. Calculation>
<6. Modification>

<1. Structure of Storage Device According to Embodiment>

First, the structure of a storage device according to an embodiment of the present disclosure will be described.

Figure 1:
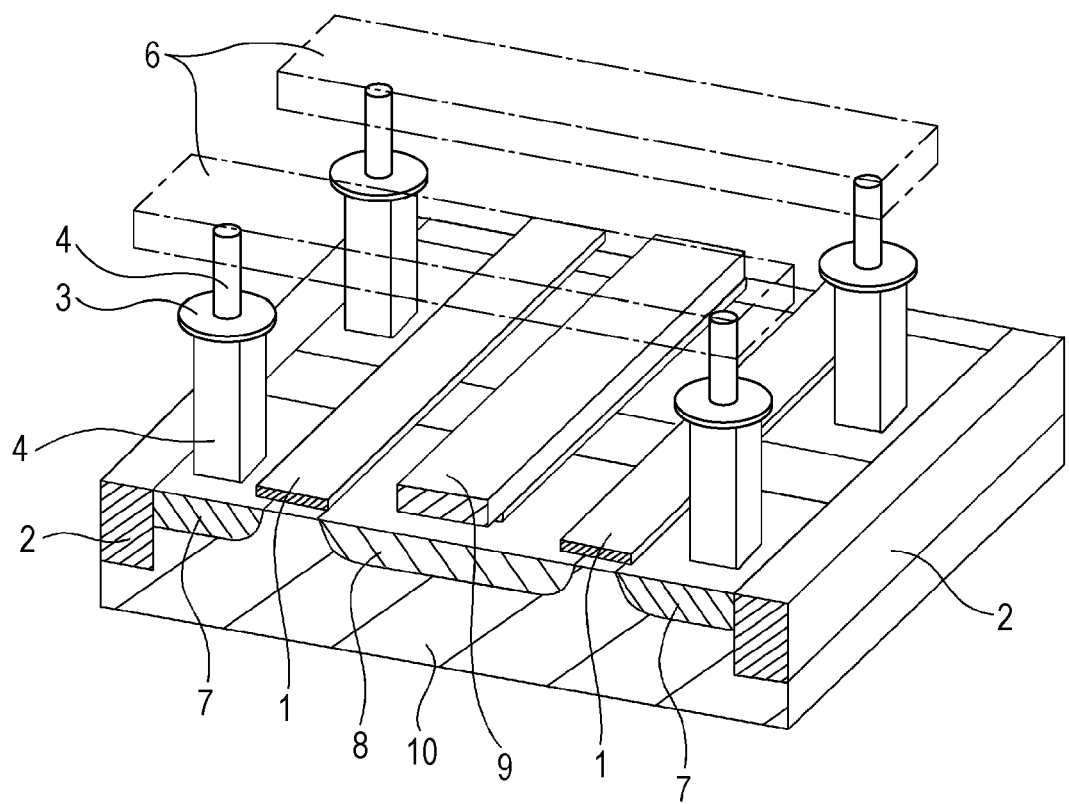
FIG. 1 is a schematic perspective view illustrating the structure of a storage device according to an embodiment.
Figure 2:
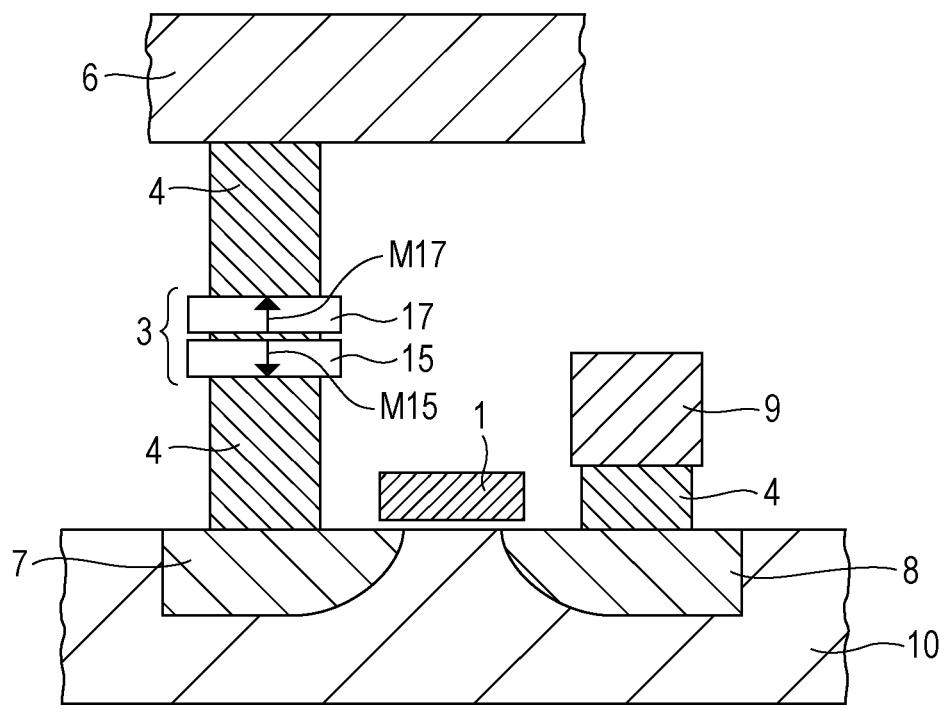
FIG. 2 is a cross-sectional view of the storage device according to the embodiment.

Schematic views of the storage device according to the embodiment are shown in FIGS. 1 and 2. FIG. 1 is a perspective view, and FIG. 2 is a cross-sectional view.

As shown in FIG. 1, in the storage device according to the embodiment, a storage element 3 of a ST-MRAM which can retain information by a magnetization state is arranged in the vicinity of the intersection of two types of address lines (such as a word line and a bit line) perpendicularly intersecting each other.

That is, a drain region 8, a source region 7, and a gate electrode 1, which form a selection transistor for selecting each storage device, are formed in an area isolated by an element isolation layer 2 of a semiconductor substrate 10, such as a silicon substrate. Among these mentioned above, the gate electrode 1 also functions as one of the address lines (word lines) extending in a front-back direction in this figure.

The drain region 8 is formed in common for the two selection transistors located at a right and a left side in FIG. 1, and a wire 9 is connected to this drain region 8.

In addition, the storage element 3 having a storage layer in which the direction of magnetization is reversed by spin torque magnetization reversal is arranged between the source region 7 and a bit line 6 provided thereabove and extending in a right-left direction in FIG. 1. This storage element 3 is formed, for example, of a magnetic tunnel junction element (MTJ element).

As shown in FIG. 2, the storage element 3 has two magnetic layers 15 and 17. Of the two magnetic layers 15 and 17, one magnetic layer is used as a magnetization pinned layer 15 in which the direction of magnetization M15 is pinned, and the other magnetic layer is used as a magnetic free layer 17, that is, a storage layer 17, in which the direction of magnetization M17 is changed.

In addition, the storage element 3 is connected to the bit line 6 and the source region 7 through respective top and bottom contact layers 4.

Accordingly, when a current is passed in the storage element 3 in a top-bottom direction through the two types of address lines 1 and 6, the direction of the magnetization M17 of the storage layer 17 can be reversed by the spin torque magnetization reversal.

In the storage device as described above, it has been well understood that writing is necessarily performed at a current equivalent to or less than a saturation current of the selection transistor, and that the saturation current thereof is decreased as the transistor is miniaturized. Accordingly, for miniaturization of the storage device, the current to be passed in the storage element 3 is preferably decreased by improving the efficiency of spin transfer.

In addition, in order to increase the intensity of a read signal, it is necessary to ensure a high rate of change in magnetoresistance, and hence, the use of the MTJ structure as described above is effective, that is, the storage element 3 in which the interlayer functioning as a tunnel insulating layer (tunnel barrier layer) is provided between the two magnetic layers 15 and 17 is effectively used.

When the tunnel insulating layer is used as the interlayer as described above, in order to prevent dielectric breakdown of the tunnel insulating layer, the current to be passed in the storage element 3 is restricted. That is, in order to ensure the reliability for repeated writing in the storage element 3, the reverse current necessary for the spin torque magnetization reversal is also preferably suppressed.

In addition, since the storage device is a non-volatile memory device, it is necessary to stably store information written by a current. That is, it is necessary to ensure the stability (thermal stability) against heat fluctuation of the magnetization of the storage layer.

If the thermal stability of the storage layer is not ensured, the direction of reversed magnetization may be again reversed with heat (temperature in operating environment), and a retention error may occur.

In the storage element 3 (ST-MRAM) of this storage device, although the scaling can be advantageously performed, that is, the volume can be decreased, as compared to a related MRAM, when the volume is decreased, the thermal stability tends to be degraded if the other properties are not changed.

When the capacity of the ST-MRAM is increased, since the volume of the storage element 3 is further decreased, to ensure the thermal stability becomes an important subject.

Therefore, in the storage element 3 of the ST-MRAM, the thermal stability is a significantly important property, and even if the volume thereof is decreased, design has to be performed to ensure this thermal stability.

<2. Outline of Storage Element According to Embodiment>

Next, the outline of the storage element 3 according to an embodiment of the present disclosure will be described.

As described above, the storage element 3 according to the embodiment performs recording by reversing the direction of the magnetization of the storage layer of the storage element using the spin torque magnetization reversal.

The storage layer is formed of a magnetic substance containing a ferromagnetic layer and is configured to retain information by a magnetization state (direction of magnetization) of the magnetic substance.

Although described later, the storage element 3 according to the embodiment has, for example, a layer structure shown in FIG. 3A and includes at least two ferromagnetic layers, the storage layer 17 and the magnetization pinned layer 15, and an interlayer 16 provided therebetween.

The storage layer 17 has magnetization perpendicular to its film surface, and the direction of the magnetization is changed corresponding to information.

The magnetization pinned layer 15 has magnetization perpendicular to its film surface which is used as the basis of the information stored in the storage layer 17.

The interlayer 16 is formed from a non-magnetic substance and is provided between the storage layer 17 and the magnetization pinned layer 15.

In addition, by injecting spin-polarized electrons in a laminate direction of the layer structure including the storage layer 17, the interlayer 16, and the magnetization pinned layer 15, the direction of the magnetization of the storage layer 17 is changed, and information is recorded in the storage layer 17.

When the spin torque magnetization reversal is performed, since a current is directly passed in the storage element for writing (recording) of information, in order to select a memory cell which performs writing, as described with reference to FIGS. 1 and 2, the storage element 3 is connected to the selection transistor to form a memory cell.

In this case, the current to be passed in the storage element 3 is restricted by the current (saturation current of the selection transistor) which can be passed in the selection transistor.

Furthermore, in consideration of the saturation current value of the selection transistor, a magnetic tunnel junction (MTJ) element is formed using a tunnel insulating layer of an insulating material as the non-magnetic interlayer 16 provided between the storage layer 17 and the magnetization pinned layer 15.

The reason for this is that when the magnetic tunnel junction (MTJ) element is formed using a tunnel insulating layer, compared to the case in which a giant magnetoresistance (GMR) element is formed using a non-magnetic conductive layer, the rate of change in magnetoresistance (MR ratio) can be increased, and the intensity of the read signal can be increased.

In addition, in particular, when magnesium oxide (MgO) is used as a material of the interlayer 16 functioning as this tunnel insulating layer, the rate of change in magnetoresistance (MR ratio) can be increased.

In addition, in general, since the efficiency of the spin transfer depends on the MR ratio, as the MR ratio is increased, the efficiency of the spin transfer is improved, and a magnetization reversal current density can be decreased.

Therefore, when magnesium oxide is used as a material of the tunnel insulating layer, and the storage layer 17 described above is simultaneously used, a write threshold current by the spin torque magnetization reversal can be decreased, and information can be written (recorded) at a low current. In addition, the intensity of the read signal can be increased.

Accordingly, the MR ratio (TMR ratio) can be ensured, the write current by the spin torque magnetization reversal can be decreased, and information can be written (recorded) at a low current. In addition, the intensity of the read signal can be increased.

When the tunnel insulating layer is formed using a magnesium oxide (MgO) film as described above, even if being crystallized, the MgO film preferably maintains crystal orientation in the 001 direction.

In addition, in this embodiment, besides magnesium oxide, the interlayer 16 (tunnel insulating layer) provided between the storage layer 17 and the magnetization pinned layer 15 may be formed, for example, using various types of insulating materials, such as aluminum oxide, aluminum nitride, $SiO_2$, $Bi_2O_3$, $MgF_2$, CaF, $SrTiO_2$, $AlLaO_3$, and Al—N—O, dielectric substance, and semiconductor.

In order to obtain a current density necessary to reverse the direction of the magnetization of the storage layer 17 by the spin torque magnetization reversal, the sheet resistance value of the interlayer 16 (tunnel insulating layer) has to be controlled to approximately several tens of ohm-micrometer squared or less.

In addition, in the interlayer 16 formed of a MgO film, in order to control the sheet resistance value within the above range, the thickness of the MgO film has to be set to 1.5 nm or less.

In addition, the size of the storage element 3 is preferably formed small so that the direction of the magnetization of the storage layer 17 can be easily reversed at a low current.

Therefore, the area of the storage element is preferably set to 0.01 µm² or less.

<3. Description of Variation in Thermal Stability and Reverse Current>

Although described above, in the ST-MRAM, by the spin torque magnetization reversal performed by a current to be passed in the storage element, it is necessary to reverse the direction of the magnetization of the storage layer. Also in this embodiment, since writing (recording) of information is performed by directly passing a current in the storage element 3, in order to select a memory cell which performs writing, the storage element is connected to the selection transistor to form a memory cell.

In this case, the current to be passed in the storage element 3 is restricted by the current (saturation current of the selection transistor) which can be passed in the selection transistor.

For this reason, since it has been understood that writing has to be carried out by a current equivalent to or less than the saturation current of the selection transistor, and that the saturation current of the transistor decreases as miniaturization is advanced, in order to perform miniaturization of the ST-MRAM, it is necessary to decrease the current to be passed in the storage element 3 by improving the efficiency of the spin transfer.

A current necessary for the spin torque magnetization reversal is represented by a current $I_{c0}$.

In addition, on the other hand, since the ST-MRAM is a non-volatile memory, it is necessary to stably store information written by a current. That is, it is necessary to ensure the stability (thermal stability) against heat fluctuation of the magnetization of the storage layer 17.

If the thermal stability of the storage layer 17 is not ensured, the direction of reversed magnetization may be again reversed with heat (temperature in operating environment) in some cases, and a retention error may occur.

As an index indicating the thermal stability, a value obtained by dividing energy necessary for reversal by heat by environmental temperature energy is used. Hereinafter, this index will be represented by $\Delta$.

In the storage element 3 as the ST-MRAM, the scaling can be advantageously performed, that is, the volume of the storage layer 17 can be decreased, as compared to a related MRAM.

However, when the volume is decreased, the thermal stability tends to be degraded if the other properties are not changed.

When the capacity of the ST-MRAM storage device as described in this embodiment is increased, since the volume of the storage element 3 is further decreased, to ensure the thermal stability becomes an important subject.

Therefore, in the storage element 3, the thermal stability is a significantly important property, and even if the volume thereof is decreased, design has to be performed to ensure this thermal stability.

That is, in order to enable the storage element 3 as the ST-MRAM to be present as a non-volatile memory, a reverse current necessary for the spin torque magnetization reversal has to be decreased to the saturation current of the transistor or less, and the thermal stability for retaining written information also has to be ensured.

As the structure which can decrease the reverse current and can ensure the thermal stability at the same time, attention has been paid on a structure in which for the storage layer, a perpendicular magnetic film is used. In this case, the "perpendicular" indicates a normal direction of a storage layer surface, and the "perpendicular magnetic film" indicates a magnetic film in which in an equivalent state, the magnetization is directed in a perpendicular direction.

In order to form the storage layer 17, which is a thin film, as a perpendicular magnetic film, the storage layer 17 has to obtain a property called perpendicular magnetic anisotropy.

As magnetic materials having perpendicular magnetic anisotropy, there are several types of materials, and for example, rare earth-transition metal alloys (such as TbCoFe), metal multilayer films (such as a Co/Pd multilayer film), ordered alloys (such as FePt), and compounds (such as Co/MgO) using interface anisotropy between an oxide and a magnetic metal may be mentioned.

In a MTJ element (hereinafter, referred to as "perpendicular MTJ") using a magnetic material having perpendicular magnetic anisotropy, the index $\Delta$ of the thermal stability and the reverse current $I_{c0}$ can be represented as follows.

$$\Delta = \frac{\mu_0 M_s^2 V}{2 k_B T}(h_k - N_z + N_x),$$ Formula 1

$$I_{c0} = \left(\frac{2e}{\hbar}\right)\left(\frac{\alpha}{\eta}\right)\mu_0 M_s^2 V(h_k - N_z + N_x)$$ Formula 2

In the above formulas, $\mu_0$ represents the vacuum permeability, Ms represents the saturation magnetization of the storage layer, V represents the volume of the storage layer, $k_B$ represents the Boltzmann constant, T represents the absolute temperature, e represents the charge of an electron, barred h represents the conversion Planck constant, $\alpha$ represents the damping constant, $\eta$ represents the rate of spin polarization, and ($N_x$, $N_z$) represents the demagnetization factor in which $N_x$ represents an in in-plane direction component, and $N_z$ represents a thickness direction component.

In addition, $h_k$ represents the non-dimensional normalized perpendicular magnetic anisotropy, and by using perpendicular magnetic anisotropy energy K, the following formula holds.

$$h_k = \frac{2K}{\mu_0 M_s^2}$$ Formula 3

Each formula shown above will be discussed in more detail. First, it is found that the thermal stability index $\Delta$ and the reverse current $I_{c0}$ have a proportional relationship and that an element which is easily reversed has a low thermal stability.

In addition, it is found that the thermal stability index $\Delta$ and the reverse current $I_{c0}$ are not determined only by the perpendicular magnetic anisotropy energy, and that the demagnetization factor ($N_x$, $N_z$) derived from the shape of the element also has influences.

In the perpendicular magnetization MTJ, the perpendicular magnetic anisotropy energy functions as a primary factor to direct the magnetization in a perpendicular direction.

On the other hand, since the shape of the storage layer 17 has a smaller length scale (several nanometers) in a thickness direction than the length scale (several tens of nanometers) in an in-plane direction, the demagnetizing field in a thickness direction works strongly and consequently works so as to decrease the perpendicular magnetic anisotropy.

For example, when the storage layer 17 has an infinite area, $N_x$ becomes zero, and $N_z$ becomes 1.

Therefore, the non-dimensional normalized perpendicular magnetic anisotropy becomes $h_k-1$ by the effect of the demagnetizing field.

On the other hand, when the storage layer 17 has a circular film surface having a diameter of 70 nm and a thickness of 2 nm, $N_x$ becomes 0.0404 and $N_z$ becomes 0.9192. In this case, the non-dimensional normalized perpendicular magnetic anisotropy becomes $h_k-0.8788$.

As described above, it is found that when the storage layer 17 is processed to have a finite size, the perpendicular magnetic anisotropy is increased, and as a result, the thermal stability index $\Delta$ and the reverse current $I_{c0}$ are increased.

As described above, it is found that the thermal stability index $\Delta$ and the reverse current $I_{c0}$ are dependent not only on the perpendicular magnetic anisotropy energy K but also on the shape of the element.

Incidentally, the processing of the storage layer 17 is performed such that after a resist is patterned by a photolithography technique, etching is performed, for example, by ion milling or reactive ion etching.

In this case, for example, since the patterned shape varies, the shape of the storage layer 17 to be formed also varies between the MTJ elements. As described above, since the shape of the storage layer 17 has close relationship with the thermal stability index $\Delta$ and the reverse current $I_{c0}$, variation is also disadvantageously generated in these properties.

For example, when the reverse current $I_{c0}$ varies between elements, writing has to be performed even at the maximum reverse current $I_{c0}$. Hence, a larger selection transistor is necessary as the variation is increased. As a result, a decrease in capacity of the memory, and/or an increase in power consumption may disadvantageously occur.

In addition, when the thermal stability index $\Delta$ varies among elements, the thermal stability of an element having a small thermal stability index $\Delta$ deteriorates, and hence the reliability of the memory may be degraded in some cases.

According to this embodiment, after the shape error to be generated in manufacturing of the storage element 3 is taken into consideration, the variation in the reverse current $I_{c0}$ and the thermal stability index $\Delta$ is suppressed.

<4. Structure According to Embodiment>

Next, a concrete structure according to an embodiment will be described.

As described above with reference to FIG. 1, in the structure of the storage device according to the embodiment, the storage element 3 capable of retaining information by a magnetization state is arranged in the vicinity of the intersection between the two types of address lines 1 and 6 (such as a word line and a bit line) perpendicularly intersecting each other.

In addition, when a current in a top-bottom direction is passed in the storage element 3 through the two types of address lines 1 and 6, the direction of the magnetization of the storage layer 17 can be reversed by the spin torque magnetization reversal.

Figure 3A:
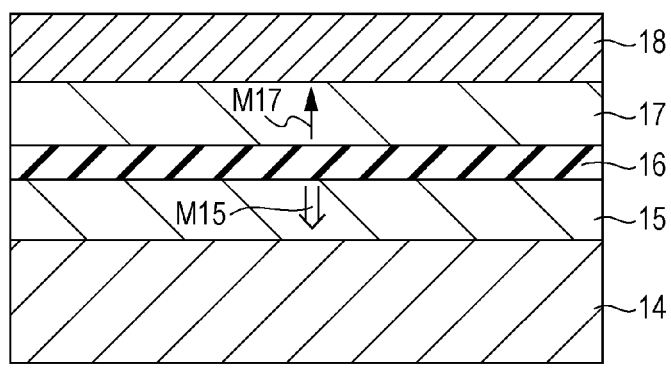
FIGS. 3A and 3B are each a cross-sectional view illustrating a layer structure of a storage element according to an embodiment.
Figure 3B:
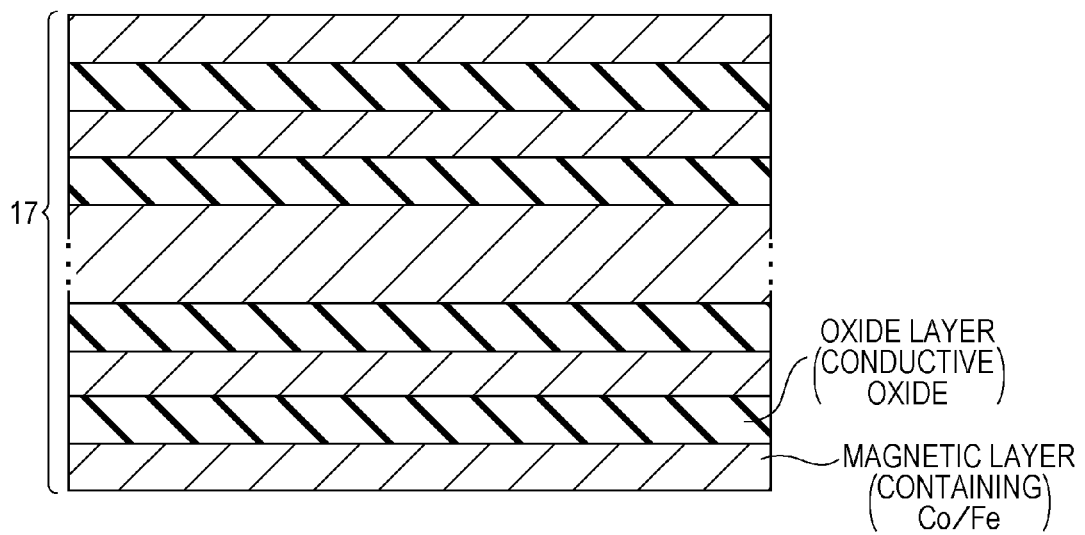

FIGS. 3A and 3B each show an example of the layer structure of the storage element 3 (ST-MRAM) according to the embodiment.

The storage element 3 has an underlayer 14, the magnetization pinned layer 15, the interlayer 16, the storage layer 17, and a cap layer 18.

As shown in the figures, in the storage element 3, the magnetization pinned layer 15 is provided at a lower side of the storage layer 17 in which the direction of the magnetization M17 is reversed by the spin torque magnetization reversal.

In addition, the relative angle between the magnetization M17 of the storage layer 17 and the magnetization M15 of the magnetization pinned layer 15 prescribes 0 or 1 information.

Between the storage layer 17 and the magnetization pinned layer 15, the interlayer 16 functioning as a tunnel barrier layer (tunnel insulating layer) is provided, and the MTJ element is formed by the storage layer 17 and the magnetization pinned layer 15.

In addition, the underlayer 14 is formed under the magnetization pinned layer 15, and the cap layer 18 is formed on the storage layer 17.

Ta, Ru, or the like is used for the underlayer 14. In addition, Ta, Ru, or the like is used for the cap layer 18.

The storage layer 17 and the magnetization pinned layer 15 each have perpendicular magnetization. Accordingly, the storage layer 17 and the magnetization pinned layer 15 each preferably formed of an alloy containing at least one of Fe, Co, and Ni as a primary component and at least one of B and C.

For example, as the storage layer 17 and the magnetization pinned layer 15, an alloy containing Fe, such as CoFeB or FeNiC, is suitable.

In addition, the storage layer 17 may be formed of a perpendicular magnetic film having the structure in which magnetic layers containing at least one of Co and Fe and conductive oxide layers are alternately laminated to each other.

In particular, the structure as shown in a cross-sectional view of FIG. 3B may be formed. That is, as an example of a magnetic layer forming the storage layer 17, layers each containing one of Co and Fe and layers each containing a conductive oxide are alternately laminated to each other.

According to this structure, the number of interfaces, each of which contributes to perpendicular magnetic anisotropy, can be increased, and this structure is advantageous for perpendicular magnetization.

As the conductive oxide, for example, $ReO_3$, $RuO_2$, $SnO_2$, $TiO_2$, $LiTi_2O_4$, $LiV_2O_4$, and $Fe_3O_4$ may be used, and in addition, a compound formed from an oxide, which is an insulating material in general, processed to have conductivity by oxygen defect, doping of a different element, or the like may also be used.

As the interlayer 16, for example, MgO (magnesium oxide) is used. When the interlayer 16 is a MgO layer, the rate of change in magnetoresistance (MR ratio) can be increased.

When the MR ratio is increased, the efficiency of spin injection is improved, and a current density necessary to reverse the direction of the magnetization M17 of the storage layer 17 can be decreased.

In the structure as described above, when the saturation magnetization of the storage layer 17 and the thickness thereof are represented by Ms (emu/cc) an t (nm), respectively, the thickness t of the storage layer 17 satisfies the condition $(1489/Ms)-0.593<t<(6820/Ms)-1.55$.

The storage element 3 according to this embodiment can be manufactured in such a way that after the underlayer 14 to the cap layer 18 are successively formed in a vacuum apparatus, the pattern of the storage element 3 is formed by processing, such as etching.

According to this embodiment, since the storage layer 17 of the storage element 3 is a perpendicular magnetic film, a write current necessary to reverse the direction of the magnetization M17 of the storage layer 17 can be decreased.

As described above, since the thermal stability, which is the information retention ability, can be sufficiently ensured, the storage element 3 can be formed to have excellent balance in properties.

Accordingly, operational errors can be avoided, and sufficient operational margins of the storage element 3 can be obtained, so that the storage element 3 can be stably operated.

Therefore, a highly reliable memory which operates stably can be realized.

In addition, by decreasing the write current, the power consumption used at the time of writing in the storage element 3 can be reduced.

Therefore, when a memory is formed using the storage element 3 of this embodiment, the power consumption of the entire memory can be reduced.

As a result, a highly reliable memory which operates stably and which has excellent information retention property can be realized, and in the memory including the storage element 3, the power consumption can be reduced.

Furthermore, according to the above embodiment, since the oxide layer forming a part of the storage layer 17 is a conductive material, a series resistance which overlaps a resistance of a tunnel barrier portion in which the tunnel magnetoresistive effect is generated and which has no contribution thereto can be decreased, and hence, the tunnel magnetoresistive effect can be prevented from being decreased.

Since the magnetoresistive effect is reflected to the intensity of the read signal, complication of a circuit and/or a decrease in reading rate caused by a decrease in signal intensity can be prevented.

In addition, when a memory having the structure shown in FIG. 1 and including the storage element 3 shown in FIG. 2 is manufactured, a general semiconductor MOS formation process can be advantageously applied. Therefore, the memory of this embodiment can be used as a general-purpose memory.

In addition, since the thickness t of the storage layer 17 is set to satisfy the condition
1489/Ms)−0.593<t<(6820/Ms)−1.55, the variation in thermal stability and reverse current can be suppressed. Accordingly, a highly reliable memory which operates stably can be realized. In addition, from the point described above, the reverse current can be decreased, and hence, the power consumption at the time of writing in the storage element can also be reduced.

In addition, chemical elements other than Co and Fe may also be added to the magnetic layer used for forming a part of the storage layer 17 according to the embodiment.

In addition, the magnetization pinned layer 15 in which the direction of the magnetization is pinned can be formed only from a ferromagnetic layer or by using antiferromagnetic coupling between an antiferromagnetic layer and a ferromagnetic layer.

In addition, the magnetization pinned layer 15 can be formed from a single ferromagnetic layer or can be formed to have a laminate ferri-pinned structure in which ferromagnetic layers are laminated with at least one non-magnetic layer provided therebetween.

As a material of the ferromagnetic layer which forms the magnetization pinned layer 15 having a laminate ferri-pinned structure, for example, Co, CoFe, and CoFeB may be used. In addition, for example, Ru, Re, Ir, and Os may be used as a material of the non-magnetic layer.

Alternatively, by using antiferromagnetic coupling between an antiferromagnetic layer and a ferromagnetic layer, the structure can be formed in which the direction of the magnetization is pinned.

As a material of the antiferromagnetic layer, for example, magnetic substances, such as a FeMn alloy, a PtMn alloy, a PtCrMn alloy, a NiMn alloy, an IrMn alloy, NiO, and $Fe_2O_3$ may be mentioned.

In addition, by addition of non-magnetic elements, such as Ag, Cu, Au, Al, Si, Bi, Ta, B, C, O, N, Pd, Pt, Zr, Hf, Ir, W, Mo, and Nb, to the above magnetic substances, the magnetic properties can be adjusted, and/or other various properties, such as the crystal structure, the crystallinity, and the stability of substances, can also be adjusted.

In addition, in the film structure of the storage element, even when the storage layer 17 is arranged at a lower side of the magnetization pinned layer 15, any problems may not occur.

<5. Calculation>

In the structure of the storage element 3 of this embodiment, the influences of various property parameters of the storage layer 17 on the thermal stability index $\Delta$ and the reverse current $I_{c0}$ were particularly investigated using a macro-spin model.

The thermal stability index $\Delta$ and the reverse current $I_{c0}$ are represented by the formulas 1 and 2, respectively, as described above.

In order to use the storage element 3 as a non-volatile memory, although depending on the capacity of a memory and/or the retention time of information, a thermal stability index $\Delta$ of 60 to 70 is necessary.

As apparent from the above formula 1, since the thermal stability index $\Delta$ includes the temperature (T) in the denominator, when an operation assurance temperature is 85° C., a higher value is necessary for the thermal stability index $\Delta$ at room temperature.

Figure 4:
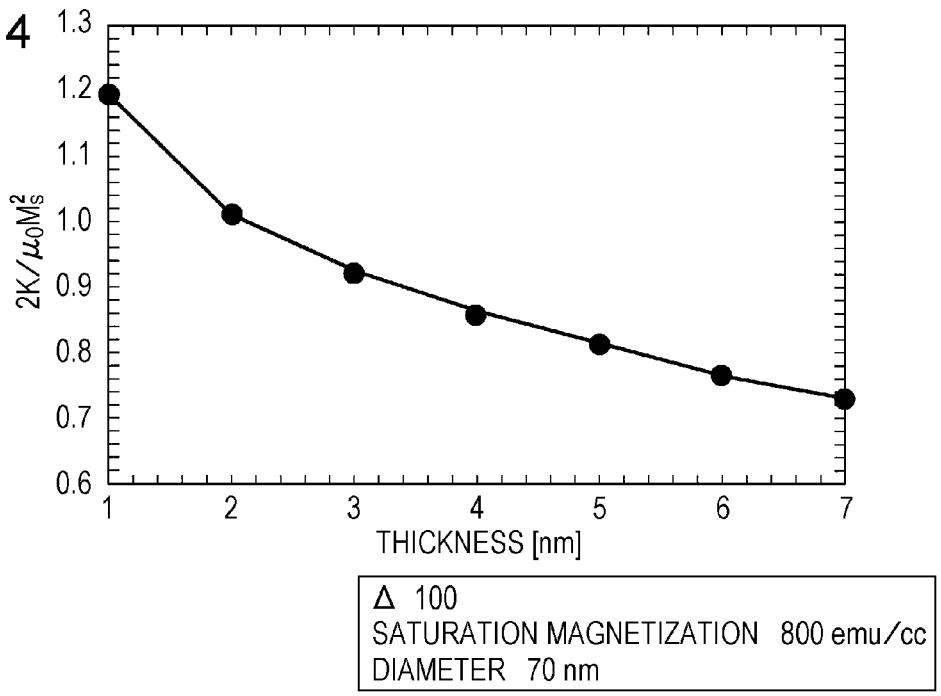
FIG. 4 is a graph showing the relationship between the thickness of a storage layer and perpendicular magnetic anisotropy energy.

Accordingly, for example, in the case in which the saturation magnetization of the storage layer 17 is 800 emu/cc, and the film surface shape thereof is a circle having a diameter of 70 nm, the relationship between the thickness of the storage layer 17 and the non-dimensional normalized perpendicular magnetic anisotropy energy in which $\Delta=100$ holds is shown in FIG. 4.

As apparent from this FIG. 4, as the thickness is increased, the demagnetization factor $N_x$ is increased, and $N_z$ is decreased. Therefore, as the thickness is increased, necessary non-dimensional normalized perpendicular magnetic anisotropy energy is decreased.

After the necessary perpendicular magnetic anisotropy energy at each thickness was obtained as described above, the shape of the storage layer 17 was varied this time, and the thermal stability index $\Delta$ was calculated.

It was assumed that the shape was varied by patterning of the storage layer 17. In this case, the variation of the shape was set to ±5 nm.

In addition, the thermal stability index $\Delta$ and the reverse current $I_{c0}$ have a proportional relationship as described above. The following description about the thermal stability index $\Delta$ can also be similarly applied to that about the reverse current $I_{c0}$.

Figure 5:
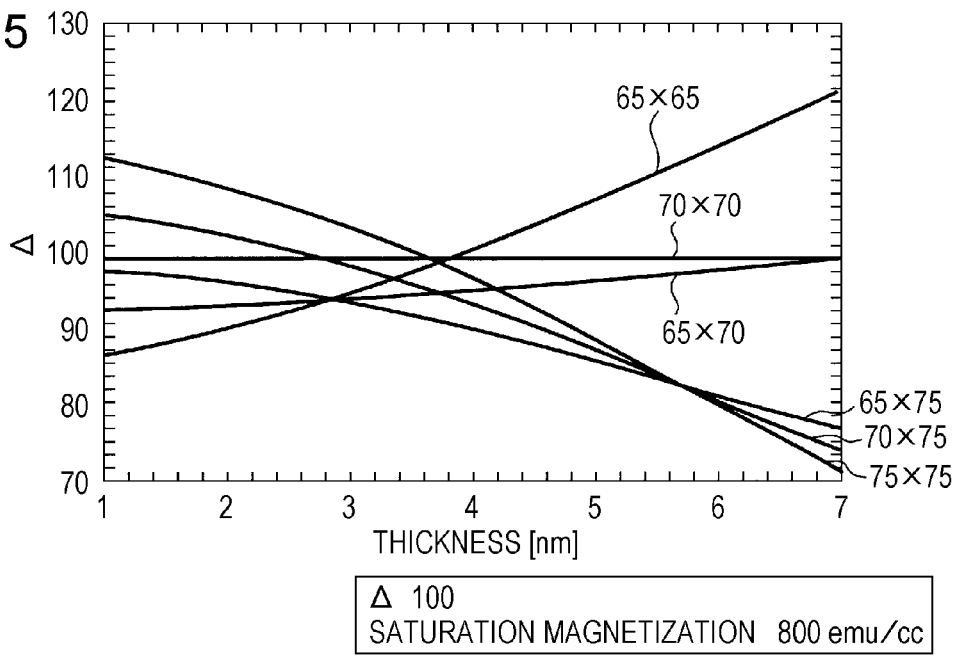
FIG. 5 is a graph showing the relationship between the thickness of the storage layer and the index of thermal stability.

The results are shown in FIG. 5. Investigation was performed in a thickness range of 1 to 7 nm of the storage layer 17.

At each thickness, as the perpendicular magnetic anisotropy energy, the value obtained from FIG. 4 was used. In addition, as the shape of the storage layer 17, a circle having a diameter of 70 nm was used as the reference, and the size was changed to 65 nm×65 nm, 65 nm×70 nm, 65 nm×75 nm, 70 nm×75 nm, and 75 nm×75 nm.

When xxy is shown as described above, if x=y holds, the shape is a circle having a diameter x(=y), and if x≠y holds, the shape is an oval having a short axis x and a long axis y.

As shown by the result of 70 nm×70 nm in FIG. 5, since this shape is used as the reference, the Δ is naturally 100 at each thickness.

On the other hand, the following is found when the results of the other shapes are observed.

That is, in the shape having a small area of 65 nm×65 nm, as the thickness is increased, the thermal stability index Δ is increased; however, in the shapes each having a large area of 65 nm×75 nm, 70 nm×75 nm, or 75 nm×75 nm, the thermal stability index Δ is decreased as the thickness is increased.

As a result, it is found that even when the shape is varied, at a thickness of approximately 3.7 nm, the change in the thermal stability index Δ is small.

Figure 6:
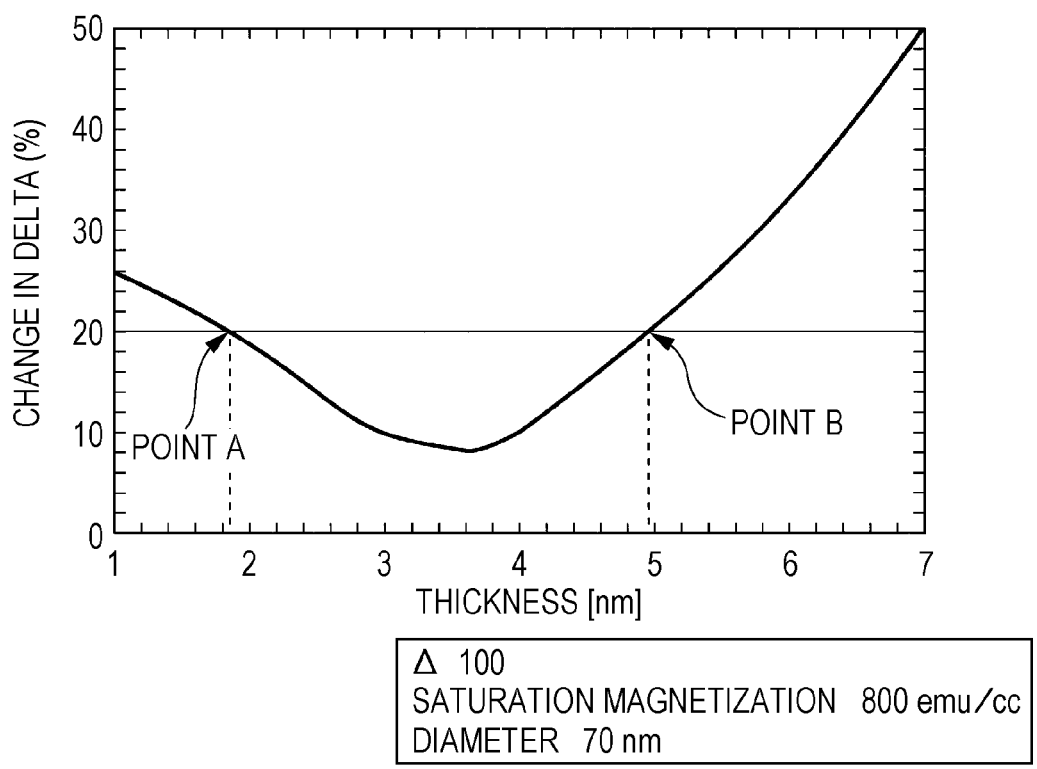
FIG. 6 is a graph showing the relationship between the thickness of the storage layer and the change in the index of thermal stability.

The relationship between the thickness of the storage layer 17 and the change in the thermal stability index Δ is shown in FIG. 6.

Incidentally, the change in the thermal stability index Δ is the value obtained by dividing the difference between the maximum Δ value and the minimum Δ value by the original Δ value (100 in this case).

When the thickness is obtained at which the change in the thermal stability index Δ is 20%, the thickness shown by the point A in the figure is 1.82 nm, and the thickness shown by the point B in the figure is 4.96 nm.

From the results thus obtained, it is found that in the case in which the thermal stability index Δ is 100, the diameter of the storage element is 70 nm, and the saturation magnetization is 800 emu/cc, when the thickness of the storage layer 17 is set in a range of 1.82 to 4.96 nm, the change Δ can be controlled within 20%.

Next, while the thermal stability index Δ and the diameter of the storage element 3 were not changed, the thickness at which the change in the thermal stability index Δ was 20% was obtained by changing the saturation magnetization.

Figure 7:
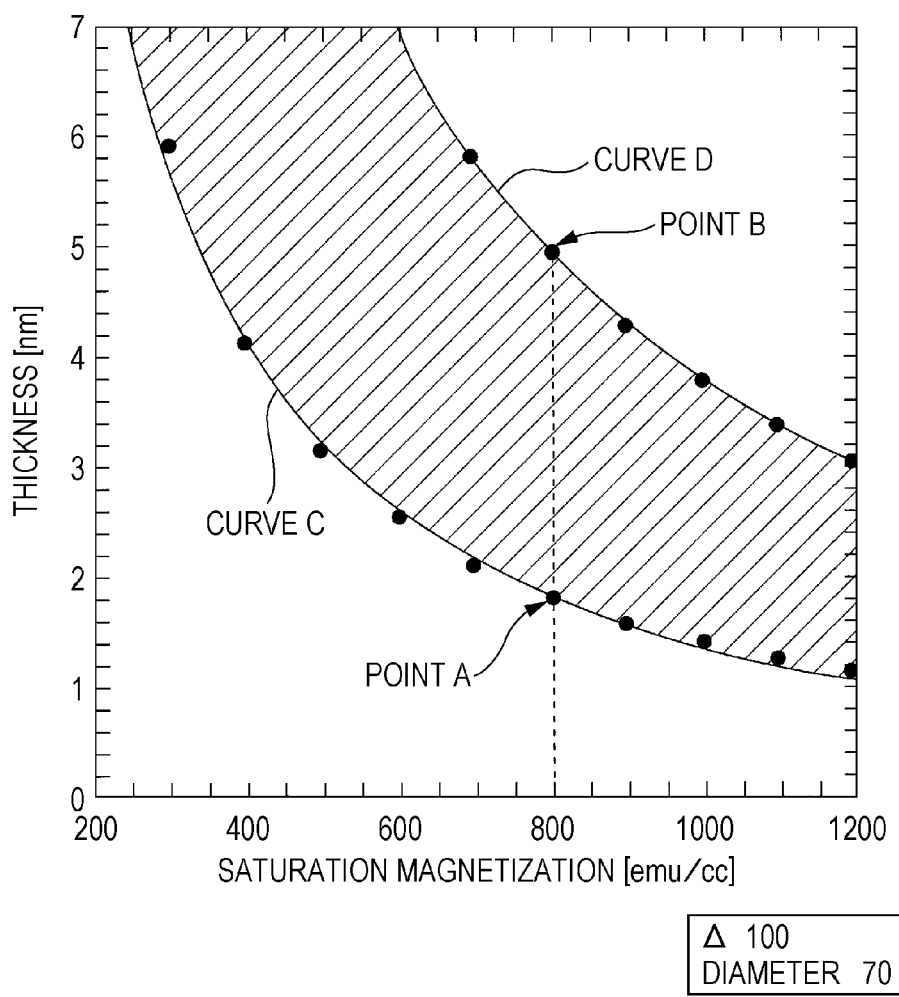
FIG. 7 is a graph showing one example of a region enclosed by the saturation magnetization of the storage layer and the thickness thereof in which the variation is minimized.

The results are shown by dots in FIG. 7. The points shown by the points A and B are obtained at a saturation magnetization of 800 emu/cc and are the same as the points A and B shown in FIG. 6.

The thickness at which the change in the thermal stability index Δ is 20% is also changed by changing the saturation magnetization.

Since this thickness was decreased when the saturation magnetization Ms was increased, this relationship was approximated by formula t=a+b/Ms. Coefficients a and b were obtained by fitting so that this formula most correctly represented the relationship between the points shown in FIG. 7.

The results are the curves C and D shown in FIG. 7. The curve C indicates a curve of a lower limit thickness including the point A, and the curve D indicates a curve of an upper limit thickness including the point B. A slash portion between the curves C and D is a range in which the change in the thermal stability index Δ is within 20%.

If the range of the thickness is particularly shown by the formula, the following is satisfied.

$$-0.536 + \frac{1907}{M_s} < t < -0.878 + \frac{4683}{M_s} \quad \text{Formula 4}$$

The left term of this formula 4 indicates the curve C in FIG. 7, and the right term indicates the curve D in FIG. 7.

As described above, the relationship between the saturation magnetization Ms (emu/cc) of the storage layer 17 and the thickness t (nm) thereof was obtained in which when the thermal stability index Δ and the diameter of the storage layer 17 are fixed, the change in the thermal stability index Δ and that in the reverse current $I_{c0}$ can be decreased.

The thermal stability index Δ and the diameter of the storage layer 17 may take various values in accordance with applications of the storage device, the design rule of semiconductor, and the like.

Typically, the thermal stability index Δ is in a range of 60 to 100, and the diameter of the storage layer 17 is in a range of 40 to 70 nm.

Accordingly, while the thermal stability index Δ and the thickness of the storage layer 17 were changed in the respective ranges, the relationship between the saturation magnetization Ms (emu/cc) of the storage layer 17 and the thickness t (nm) thereof in which the change in the thermal stability index Δ was 20% was investigated.

Figure 8:
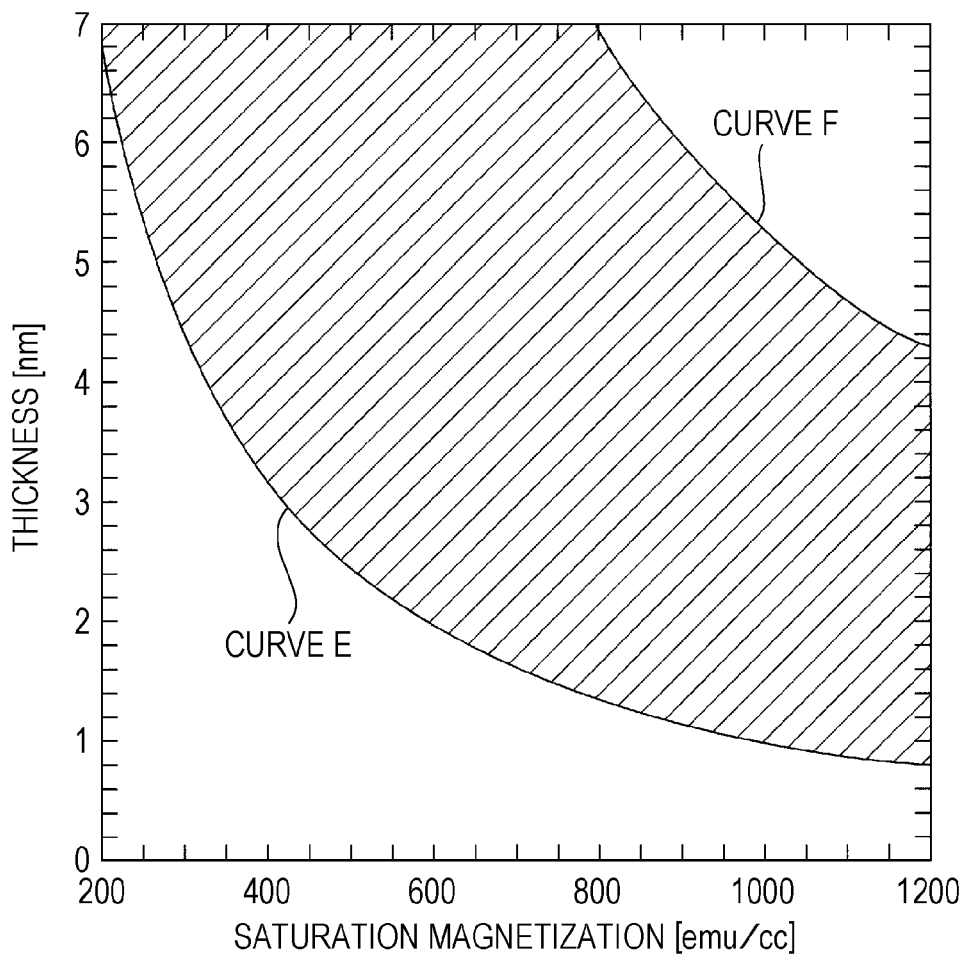
FIG. 8 is a graph showing a region enclosed by the saturation magnetization of the storage layer and the thickness thereof in which the variation is minimized.

An upper limit boundary (curve F) and a lower limit boundary (curve E) of the relationship between the saturation magnetization Ms (emu/cc) of the storage layer 17 and the thickness t (nm) thereof are shown in FIG. 8. A region of a slash portion is a region in which the change in the thermal stability index Δ can be controlled within 20%.

If this range is particularly shown by the formula, the following is satisfied.

$$-0.593 + \frac{1489}{M_s} < t < -1.55 + \frac{6820}{M_s} \quad \text{Formula 5}$$

From the results described above, it is found that when the relationship between the saturation magnetization Ms of the storage layer 17 and the thickness t thereof satisfies the formula 5, even if the shape of the storage layer 17 is varied, the change in the thermal stability index Δ and that in the reverse current $I_c0$ can be decreased.

<6. Modification>

Although the embodiments have thus been described, the technique of the present disclosure may be applied not only to the film structure of the storage element 3 shown in the above embodiments but also to various film structures.

For example, in the embodiment, although being formed from CoFeB, the magnetization pinned layer 15 is not limited to the embodiment, and various structures may be used.

In addition, although the single underlayer 14 and the single cap layer 18 are illustrated in the embodiment by way of example, a laminate structure may also be applied thereto.

In addition, the underlayer 14 and the cap layer 18 may also be formed from various materials.

As the film surface shape of the storage element 3, besides the circular shape, various shapes, such as an oval shape and a polygonal shape, may also be used.

In addition, the technique of the present disclosure may also take the following structure.

(1) There may be provided a storage element including a storage layer which retains information by a magnetization state of a magnetic substance; a magnetization pinned layer having magnetization which is used as the basis of the information stored in the storage layer; and an interlayer of a non-magnetic substance provided between the storage layer and the magnetization pinned layer, and in this storage element, information is stored by reversing magnetization of the storage layer using spin torque magnetization reversal generated by a current passing in a laminate direction of a layer structure including the storage layer, the interlayer, and the magnetization pinned layer, and when the saturation magnetization of the storage layer and the thickness thereof are represented by Ms (emu/cc) and t (nm), respectively, $(1489/Ms)-0.593<t<(6820/Ms)-1.55$ holds.

(2) In the storage element of the above (1), the storage layer and the magnetization pinned layer each have magnetization perpendicular to its film surface.

(3) The storage element of the above (1) or (2) further includes a cap layer adjacent to the storage layer at a side opposite to the interlayer.

(4) In the storage element of one of the above (1) to (3), the thickness t (nm) of the storage layer is in a range of 40 to 70 nm.

(5) In the storage element of one of the above (1) to (4), the storage layer is a perpendicular magnetic film having the structure in which at least one magnetic layer containing at least one of Co and Fe and at least one conductive oxide layer are alternately laminated to each other.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A storage element comprising:
   a storage layer which retains information by a magnetization state of a magnetic substance;
   a magnetization pinned layer having magnetization which is used as the basis of the information stored in the storage layer; and
   an interlayer of a non-magnetic substance provided between the storage layer and the magnetization pinned layer,
   wherein the storage element is configured to store information by reversing magnetization of the storage layer using spin torque magnetization reversal generated by a current passing in a laminate direction of a layer structure including the storage layer, the interlayer, and the magnetization pinned layer, and
   when the saturation magnetization of the storage layer and the thickness thereof are represented by Ms (emu/cc) and t (nm), respectively, $(1489/Ms)-0.593<t<(6820/Ms)-1.55$ holds.

2. The storage element according to claim 1,
   wherein the storage layer and the magnetization pinned layer each have magnetization perpendicular to its film surface.

3. The storage element according to claim 1,
   further comprising a cap layer adjacent to the storage layer at a side opposite to the interlayer.

4. The storage element according to claim 1,
   wherein a diameter of the storage layer is in a range of 40 to 70 nm.

5. The storage element according to claim 1,
   wherein the storage layer is a perpendicular magnetic film having the structure in which at least one magnetic layer containing at least one of Co and Fe and at least one conductive oxide layer are alternately laminated to each other.

6. A storage device comprising:
   two types of wires intersecting each other; and
   a storage element which is arranged therebetween, which retains information by a magnetization state of a magnetic substance, and which includes:
      a storage layer which retains information by a magnetization state of a magnetic substance;
      a magnetization pinned layer having magnetization which is used as the basis of the information stored in the storage layer, and
      an interlayer of a non-magnetic substance provided between the storage layer and the magnetization pinned layer,
   wherein the storage element is configured to store information by reversing magnetization of the storage layer using spin torque magnetization reversal generated by a current passing in a laminate direction of a layer structure including the storage layer, the interlayer, and the magnetization pinned layer,
   when the saturation magnetization of the storage layer and the thickness thereof are represented by Ms (emu/cc) and t (nm), respectively, $(1489/Ms)-0.593<t<(6820/Ms)-1.55$ holds, and
      the current in a laminate direction passes in the storage element through the two types of wires, so that the spin torque magnetization reversal occurs.

* * * * *